(12) United States Patent
Souter

(10) Patent No.: US 8,778,799 B2
(45) Date of Patent: Jul. 15, 2014

(54) LASER REMOVAL OF CONDUCTIVE SEED LAYERS

(75) Inventor: Matthew E. Souter, Tustin, CA (US)

(73) Assignee: Tamarack Scientific Co. Inc., Corona, CA (US)

( * ) Notice: Subject to any disclaimer, the term of this patent is extended or adjusted under 35 U.S.C. 154(b) by 5 days.

(21) Appl. No.: 13/348,063

(22) Filed: Jan. 11, 2012

(65) Prior Publication Data

US 2012/0184099 A1 Jul. 19, 2012

Related U.S. Application Data

(60) Provisional application No. 61/432,539, filed on Jan. 13, 2011.

(51) Int. Cl.
*H01L 21/311* (2006.01)
(52) U.S. Cl.
USPC 438/669; 257/615; 257/E21.09; 257/E21.021; 257/E21.314; 257/528
(58) Field of Classification Search
USPC .................. 438/669, 700, 795, 478
See application file for complete search history.

(56) References Cited

U.S. PATENT DOCUMENTS

| 5,221,426 A | 6/1993 | Tessier et al. |
| 6,262,579 B1 | 7/2001 | Chazan et al. |
| 7,994,045 B1 | 8/2011 | Huemoeller et al. |
| 8,263,486 B1 | 9/2012 | Huemoeller et al. |
| 8,426,966 B1 | 4/2013 | Huemoeller et al. |
| 2005/0020087 A1* | 1/2005 | Wagner et al. ................ 438/700 |
| 2007/0032095 A1* | 2/2007 | Ramaswamy et al. ........ 438/795 |
| 2009/0218233 A1 | 9/2009 | Fredenberg et al. |

FOREIGN PATENT DOCUMENTS

| WO | WO 2007/096463 A1 | 8/2007 |
| WO | WO 2010/123976 A1 | 10/2010 |

\* cited by examiner

*Primary Examiner* — Chuong A Luu
*Assistant Examiner* — Rodolfo Fortich
(74) *Attorney, Agent, or Firm* — Haynes and Boone, LLP

(57) ABSTRACT

A method for making conductive traces and interconnects on a surface of a substrate includes, for an embodiment, forming a dielectric or polymer layer on the surface of the substrate, forming a seed layer of an electrically conductive material on the dielectric or polymer layer, patterning a photoresist on the seed layer, forming the conductive traces on the patterned photoresist and seed layer, removing the photoresist from the substrate, and irradiating the surface of the substrate with a fluence of laser light effective to ablate the seed layer from areas of the substrate surface exclusive of the conductive traces.

24 Claims, 7 Drawing Sheets

LASER REMOVAL OF CONDUCTIVE SEED LAYERS

CROSS-REFERENCE TO RELATED APPLICATIONS

This application claims the benefit of and priority to U.S. Provisional Patent Application No. 61/432,539, filed Jan. 13, 2011, which is incorporated herein by reference in its entirety.

BACKGROUND

1. Technical Field

This application relates to techniques for fabricating electronics substrates and semiconductor wafers in general, and more particularly, to systems and methods for removing surplus conductive seed layers from such substrates and wafers using lasers.

2. Related Art

In the Advanced Electronics Packaging and Electronics Substrate processing fields, a so-called "seed layer" of copper (Cu), titanium (Ti), titanium/copper (Ti/Cu), titanium tungsten/copper (TiW/Cu), titanium (Ti), chrome/copper (CrCu), nickel (Ni), palladium (Pd) or the like, is deposited, typically by sputtering or other equivalent methods, onto a wafer or substrate, and then used as a target for plating electrically conductive traces or structures thereon, e.g., bonding pads, redistribution layers (RDLs) and the like. Once the desired conductive traces are formed and the photoresist used for patterning removed, the surplus seed layer, i.e., the seed layer still present on the substrate outside of the conductive traces and structures, must be removed, which is conventionally effected using a wet chemical, dry chemical or a plasma etch process.

However, there are a number of drawbacks associated with these conventional surplus seed layer removal processes. For example, they can prevent the formation of finer pitch structures, they also etch the conductive circuitry that is meant to be left behind, they promote undercutting and thus, yield of the metalized features left behind, leave contaminates on the seed layer that can mask the etch affecting yield, they necessitate increased process times and more expensive methodologies and equipment and thereby constitute an undesirably higher cost of ownership, limited process capability and are less friendly to the environment.

Accordingly, there is a need in this industry for systems and methods for the removal of surplus seed layers that enable higher yields, the production of finer pitch structures and that are simpler, less expensive, and more friendly to the environment than the chemical, dry or plasma etch processes of the prior art.

SUMMARY

In accordance with one or more embodiments of the present invention, systems and methods are provided for removing surplus seed layers from substrates using laser ablation systems that avoid the above and other drawbacks of the prior art.

In one example embodiment, an apparatus for removing a surplus seed layer from a surface of a substrate comprises a stage configured to receive and hold the substrate and a device for irradiating the surface with laser light (e.g., a fluence of laser light) effective to ablate the surplus seed layer from the surface.

In another embodiment, a method for removing surplus seed layer from the surface of a substrate comprises irradiating the surface with laser light (a fluence of laser light) effective to ablate the surplus seed layer away from the surface.

In another embodiment, a method for making conductive traces on a surface of a substrate comprises forming a dielectric layer on the surface of the substrate, forming a seed layer of an electrically conductive material on the dielectric layer, forming a layer of photoresist on the seed layer, patterning the photoresist, forming the conductive traces on the patterned photoresist and seed layer, removing the photoresist from the substrate, and irradiating the surface of the substrate with laser light (a fluence of laser light) effective to ablate the seed layer from areas of the substrate surface exclusive of the conductive traces.

A better understanding of the above and other features and advantages of the systems and methods of the present invention can be had from a consideration of the detailed description of some example embodiments thereof below, particularly if such consideration is made in conjunction with the appended drawings, wherein like reference numerals are used to identify like elements illustrated in one or more of the figures thereof.

DETAILED DESCRIPTION

In the electrical substrate and wafer fabrication industry, the formation of conductive structures, e.g., traces, bonding pads, conductive bump interconnects, redistribution layer (RDL) traces, and the like, upon a surface of the substrate typically begins with the formation of a dielectric or electrically insulating layer on a "working" or "active" surface of the substrate. The insulating layer can comprise a polymer, such as a polyimide, or polybenzobisoxazole or "PBO," e.g., HD8930, HD8820 or HD4100, all available from HD Micro-Systems (http://hdmicrosystems.com), which can be deposited onto the substrate, for example, by a spinning operation. Alternatively, another type of insulator, such as silicon dioxide ($SiO_2$) or silicon nitride ($SiNx$), can be formed on the substrate, such as a silicon wafer, using well-known oxidation techniques.

Following this, a "seed layer" of, e.g., Cu, Ti/Cu, TiW/Cu, Ti, CrCu, Ni, Pd or the like, is deposited over the insulating layer on the substrate, e.g., by sputtering. For example, a Ti/Cu seed layer having a thickness of, e.g., less than about 700 nanometers (nm) can be formed over the insulating layer. A photoresist is then applied on top of the metal seed layer, where it is patterned and developed using well-known photolithographic techniques. Following the resist develop process, the patterned metal seed layer provides a target for depositing a conductive material, e.g., Cu, onto the Ti/Cu seed layer exposed within the patterned photoresist, for example, using conventional plating techniques.

Figure 3:
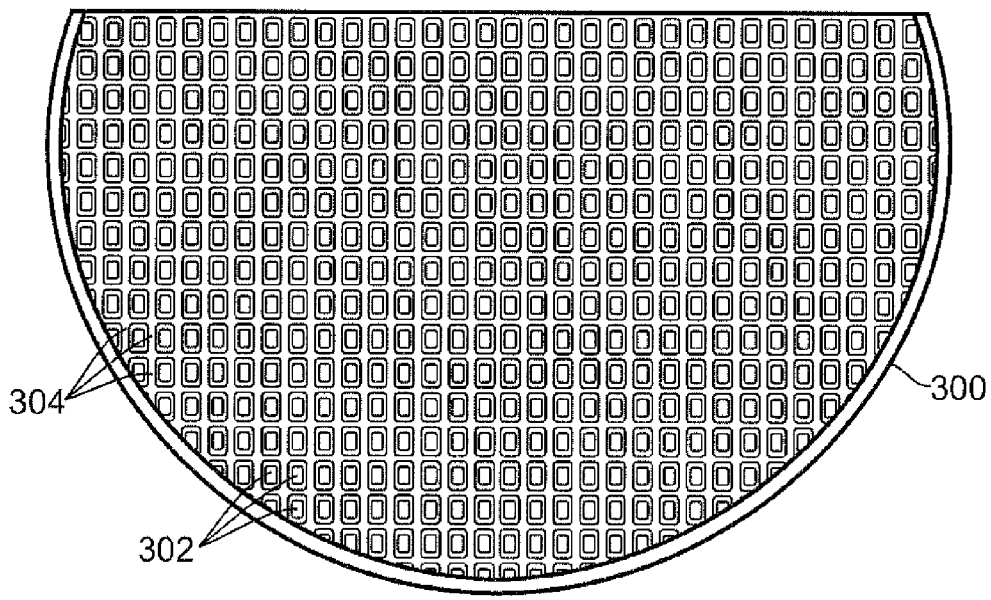
FIG. 3 is a partial top plan view of a semiconductor wafer having a surface upon which a plurality of identical conductive patterns have been formed, showing the wafer before the surplus seed layer is removed therefrom in accordance with an embodiment of the present invention.

Following this, the resist is stripped from the substrate, leaving the desired patterned, thicker Cu structures, e.g., circuit traces, pads, conductive bump interconnects, RDL traces, and the like, along with the thinner, "surplus" Ti/Cu seed layer remaining between the structured patterns, such as exhibited on the plated wafer 300 illustrated in FIG. 3 (e.g., although a round wafer is shown as an example, the shape, such as round or square or other desired shape, and dimensions are not limiting). As can be seen in FIG. 3, the wafer 300 includes a plurality of identical, thicker Cu structures 302, as well as a thin, surplus seed layer 304 located interstitially of the Cu structures 302, which must be removed to prevent short circuiting between the structures 302.

Conventionally, surplus seed layers are removed from wafers or substrates using either a wet, dry or plasma etch process. However, there are a number of drawbacks associated with these conventional processes, in that they become "process-limited" as the requirement for finer pitch structures and yields are required, and the process times and methods involved can constitute a higher cost of ownership in applications in which this consideration is highly sensitive. Additionally, some of the conventional processes are environmentally unfriendly.

For example, in the case of the wet etching process, wet etching causes an undercutting of the metal circuitry desirably left behind, e.g., the Cu "pillars" or RDL traces 302 formed on the substrate 300. This undercutting reduces the contact area of the metal circuitry, thereby contributing to lower yields and product reliability.

Additionally, the wet etch process is not selective. Thus, all metal features are etched, including those the manufacturer wishes to leave remaining, e.g., metal circuitry traces and interconnect bumps. As interconnect bumps and circuitry traces become smaller by design, the effectiveness of wet etching becomes increasingly limited, because the same amount of etching occurs on the circuitry patterns which the manufacturer wants to leave behind as occurs on the unwanted surplus seed layer. This adversely affects product reliability and limits feature dimensions, e.g., the pitch, of the circuitry being left behind. As will be appreciated, when the pitch between relatively high-aspect-ratio features decreases, this also increases the difficulty in removing the seed layer by means of the wet etch process. This, in turn, provides constraints on chip design and limits the spacing that can be used between the metal structures.

Additionally, as will be appreciated, the wet etch process uses harsh chemicals that etch away the metal seed layer. However, the process steps prior to the etching step involve applying various materials to the metal seed layer, residual amounts of which can be left behind as residues. These residues, which can be several nanometers thick, act as contaminates on the metal seed layer that "mask" the wet etch process, causing incomplete removal of the metal seed layer and resulting in shorts.

Further, the wet etch process requires relatively large amounts of caustic chemicals to etch away the metal seed layer. In addition, these same etch chemicals also tend to leach into the underlying insulating material, with a resultant negative yield affect. The by-product of the chemical etch process is a hazardous waste that requires costly hazardous waste disposal methods. The precious metals that are removed are saturated into the chemical etchant and are disposed of along with the chemical etchant. With the worldwide concentration on so-called "Green" initiatives, use and disposal of these chemicals are deemed highly undesirable.

The plasma etching process entails similar drawbacks, to which are added the higher costs typically associated with the equipment needed to produce and control the plasma etch.

However, the systems and methods described herein for removing surplus seed layers from substrates using lasers effectively overcome the above and other drawbacks of the conventional methods and offer enhanced process capabilities and lower manufacturing costs. They enable production of devices at lower costs and larger volumes by using a simple, clean laser ablation technique. As discussed further herein, laser-based seed layer removal can thus reduce the overall product manufacturing costs and improve process capability and yields.

Additionally, laser removal of the surplus seed layer causes no undercutting of the metal circuitry, thereby enabling better reliability as circuitry features become smaller. The laser processing method is also more selective in its material removal, in that it removes the undesired surplus seed layer without removing the desired thicker circuitry patterns (e.g., metal bumps and RDL traces). The constraints on chip design and limits on the spacing that can be used between the metal structures are eliminated using the laser process. Additionally, with the laser removal process, processing contaminates have no affect on the ablation process, thus eliminating the yield issues that affect the wet or dry etch processes. Moreover, the laser process requires no harsh chemicals to etch the substrate, thereby contributing to the Green initiatives. Further, as described in more detail below, a majority of the precious metals in the surplus seed layer can be reclaimed through the ablation process, thereby enabling the manufacturer to recycle and reuse the metal that is removed.

Figure 1:
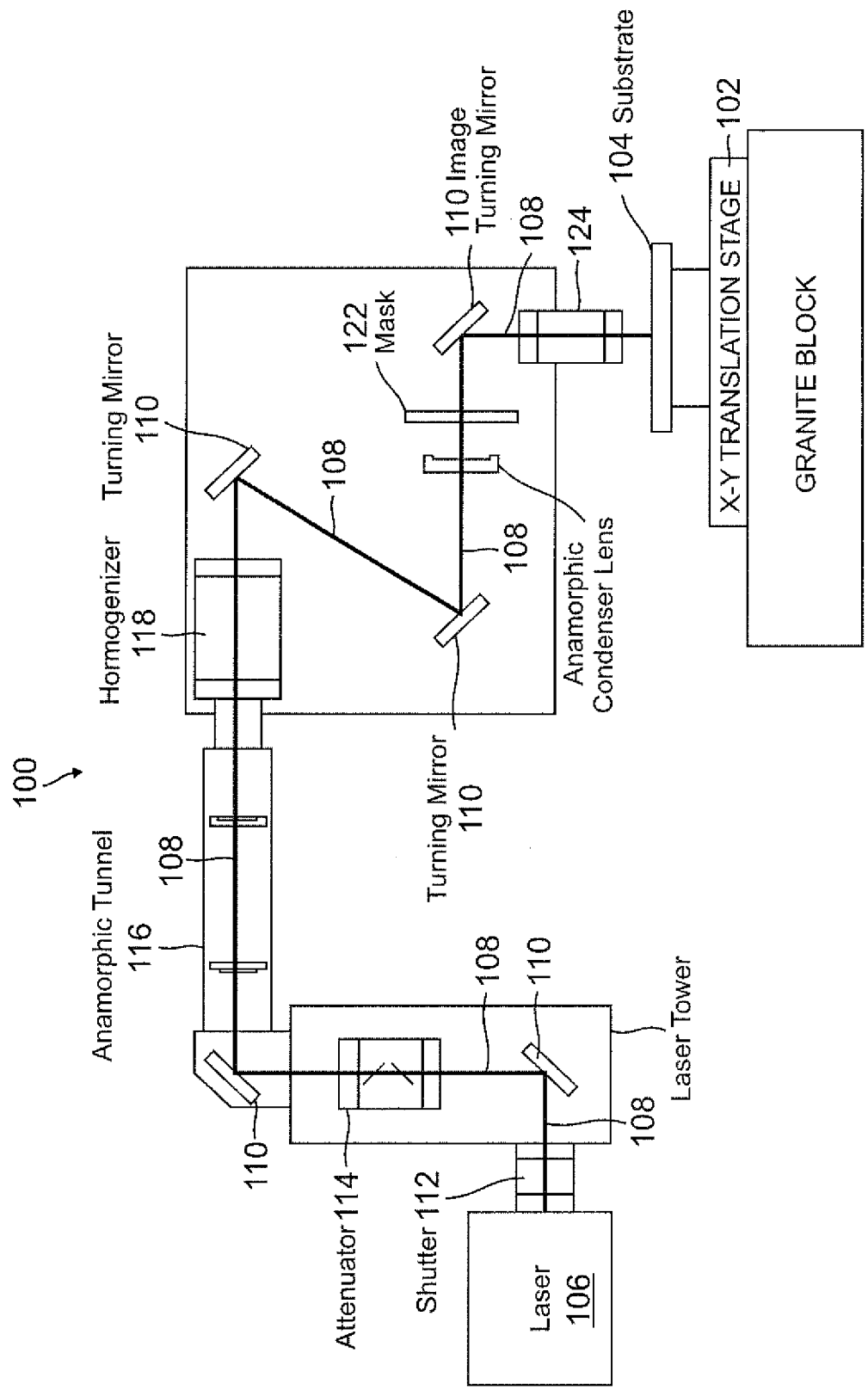
FIG. 1 is a schematic side elevation view of an example embodiment of an apparatus for removing a surplus seed layer from a substrate in accordance with an embodiment of the present invention.
Figure 2:
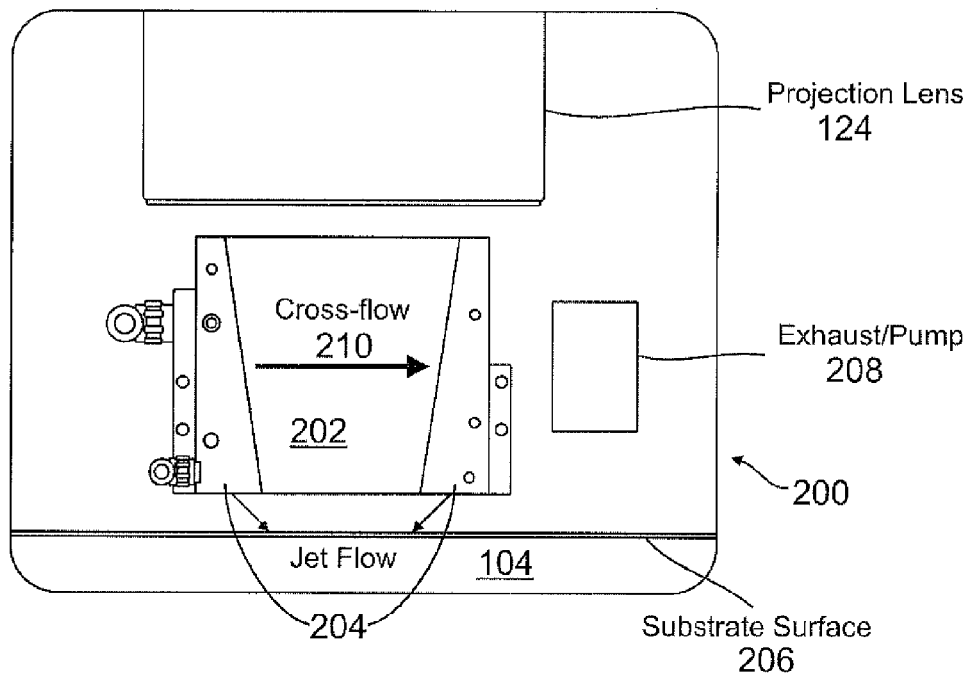
FIG. 2 is a schematic side elevation view of an example embodiment of a debris removal system for collecting and storing the surplus seed layer removed by the apparatus of FIG. 1.

Apparatus useful for carrying out the surplus seed layer laser ablation techniques described herein are illustrated in FIGS. 1 and 2, wherein FIG. 1 is a schematic side elevation view of an example embodiment of an apparatus 100 for laser removal of a surplus seed layer from a substrate, and FIG. 2 is a schematic side elevation view of an example embodiment of a debris removal system 200 for collecting and storing the surplus seed layer removed by the apparatus 100 of FIG. 1, as discussed herein.

As can be seen with reference to FIG. 1, the example laser ablation apparatus 100 comprises a movable X-Y translation stage 102 upon which a substrate 104 is retained for laser processing, an irradiating device comprising a laser light source 106 operable to produce a beam 108 of coherent laser light having a specific, predetermined wavelength, and a plurality of optical elements operable in cooperation with each other to selectably irradiate the upper surface of the substrate 104 with the laser light beam 108 and to control the fluence of the light beam at that surface. In the particular example embodiment illustrated in FIG. 1, these elements include a plurality of turning mirrors 110 arranged to alter the direction of the light beam 108, a shutter 112 operable to selectably block or allow passage of the light beam, an attenuator 114 operable to selectably attenuate the light beam, an anamorphic tunnel 116 operable to control the shape of the light beam, a homogenizer 118 operable to control the uniformity of the light beam, an anamorphic condenser lens 120 operable to selectably shape and focus the light beam, a mask 122 configured to crop the light beam, and a projection lens 124 operable to condense and focus the light beam on the upper surface of the substrate 104.

As those of skill in the art should appreciate, the particular embodiment of laser ablation apparatus 100 illustrated in FIG. 1 is presented by way of example only, and not by way of any limitation, and accordingly, other devices having a fewer or greater number and/or types of laser light sources and/or optical elements can be confected that might also be effective in the removal of surplus seed layers, depending on the particular application at hand.

As will be further appreciated, many types of laser light sources 106 can be used for effective ablation of seed layers, including without limitation, solid state, LED and gas lasers. For example, an excimer laser of the type available from, e.g., Tamarack Scientific Co., Inc. (http://www.tamsci.com) can be used advantageously. An excimer laser uses a combination of a noble gas (e.g., argon, krypton, or xenon) and a reactive gas (fluorine or chlorine) which, under the appropriate conditions of electrical stimulation, create a pseudo-molecule called an "excimer" (or in the case of noble gas halides, an "exciplex") which can only exist in an energized state, and which give rise to laser light with a wavelength in the ultraviolet region.

The UV light from an excimer laser is absorbed efficiently by both biological matter and organic compounds. Rather than burning or cutting the material irradiated therewith, the excimer laser adds enough energy to disrupt the molecular bonds of the surface tissue, which effectively disintegrates into the air in a tightly controlled manner through ablation rather than through burning. Thus, excimer lasers have the useful property that they can remove exceptionally fine layers of surface material with almost no heating or change to the remainder of the material, which is left virtually unaffected.

FIG. 2 illustrates an example embodiment of a debris removal system 200 for collecting and storing the material of the surplus seed layer removed by the example laser ablation apparatus 100 of FIG. 1. As can be seen in FIG. 2, the debris removal system 200 is disposed closely below and adjacent to the projection lens 124 of the ablation apparatus 100 and comprises a frustoconical chamber 202 with an open top and bottom, around the periphery of which is disposed a plurality of orifices or jets 204 for jetting streams of a gas, e.g., air, onto the upper or working surface 206 of a substrate 104 from which a seed layer is being ablated. As indicated by the arrow 210, the gas jets 204 work in cooperation with an exhaust/pump 208 to create a high velocity cross-flow of the gas in the chamber 202 that sweeps away the loose, ablated-away seed layer from the substrate surface 206 and collects it for recycling and reuse, as discussed above, in the manner of a small but powerful vacuum cleaner.

As discussed in more detail below, the debris removal system 200 is fixed below the projected laser beam between the projection lens 124 and the substrate 104, and moves conjointly with the laser ablation apparatus 100 relative to the substrate 102, or vice-versa, such that it cleans the same area as that being irradiated by the laser apparatus 100. As will be appreciated, this movement of the laser ablation apparatus 100 relative to the substrate 102 can be effected by moving the substrate 104 relative to the apparatus 100 (using, e.g., the X-Y translation stage 102), by moving the apparatus 100 relative to the substrate 104, or by moving both of the two devices relative to each other.

The laser removal of thin conductive seed layers of materials, such as copper, gold, silver, titanium, palladium, tantalum and many others, can be directly ablated away when applied to an underlying dielectric or polymer using an Excimer laser process. Laser ablation is a "subtractive" process in which the thin metal layer is ablated away directly by a high-energy UV beam projected from the Excimer or other laser apparatus 100. Typically, the metal seed layer is formed with a thickness of less than about 1 micrometer ($\mu$m) in order for the ablation process to occur. At this thickness, the metal seed layer readily ablates. All other circuit structures present on the substrate, i.e., those having a thickness greater than about 1 $\mu$m, require a significantly higher amount of laser fluence to remove. Thus, the desired circuit patterns remain, while the seed layer is readily removed. The result is a complete removal of the metal seed layer without damaging the underlying polymer layer or any ablation of the RDL traces, pillars or other circuitry patterns that it is desired to leave on the substrate 104.

Figure 4A:
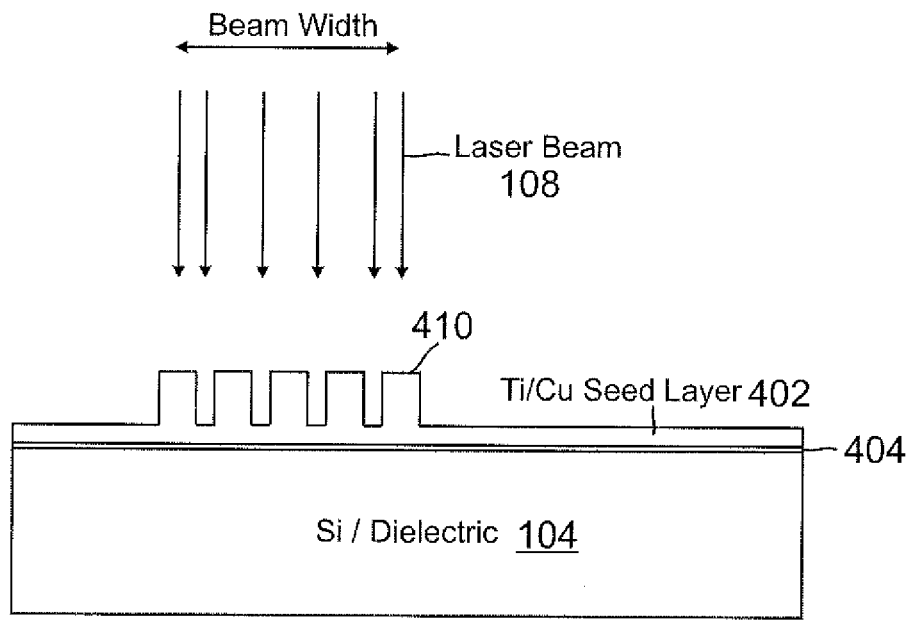
FIGS. 4A-4D are schematic partial side elevation views of a substrate showing sequential steps involved in an example method for the removal of a surplus seed layer therefrom in accordance with an embodiment of the present invention.
Figure 4B:
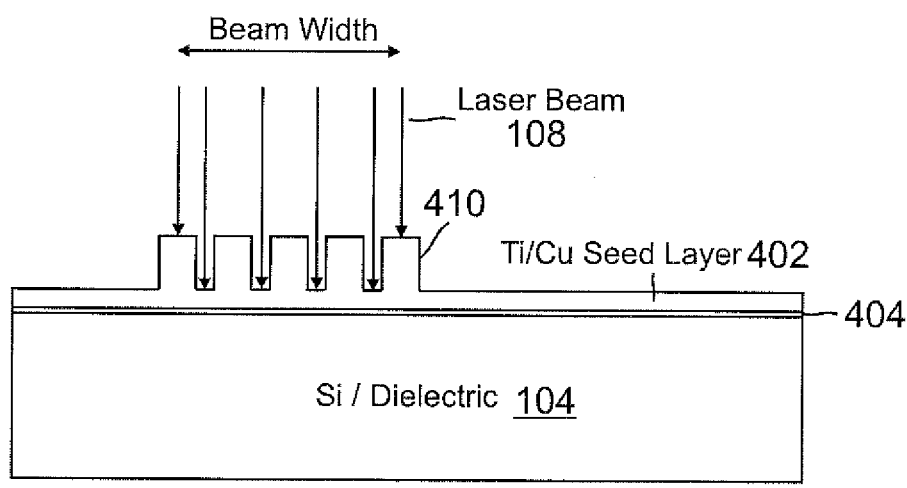
Figure 4C:
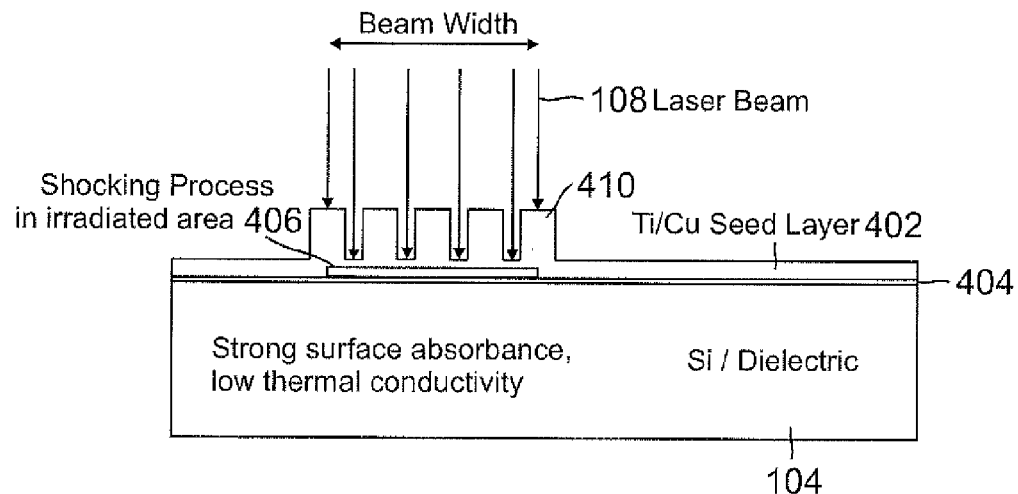
Figure 4D:
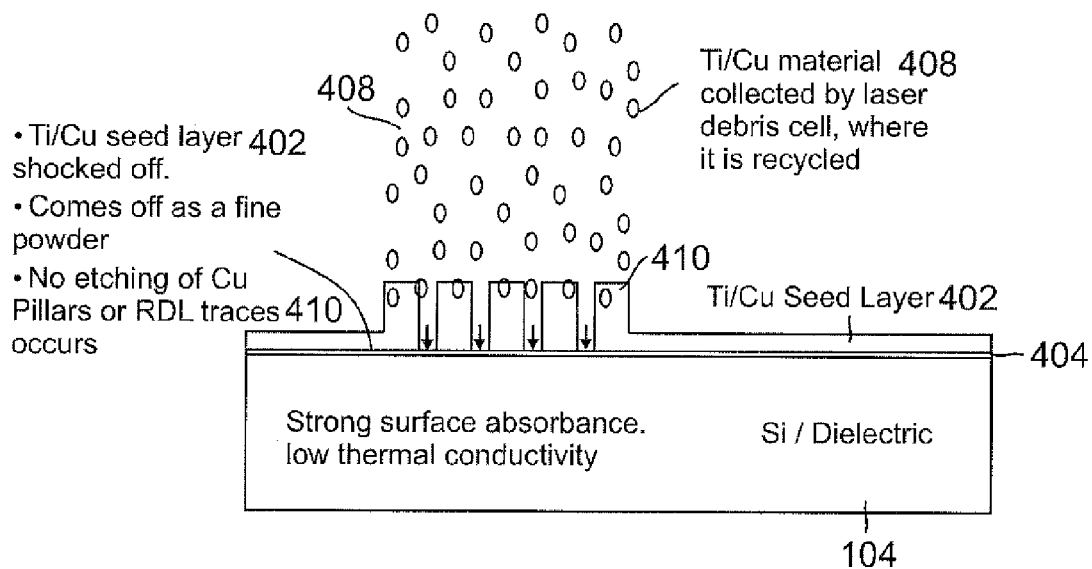

As illustrated in FIGS. 4A-4D, during the ablation process, the metal (Ti/Cu in the figures) seed layer 402 disposed on the dielectric or polymer layer 404 on the substrate 104 (Si/dielectric in the figures) fractures in the area 406, between the thicker circuitry pillars or traces 410, irradiated by the laser beam 108 by the strong tensile stress induced by a rapid heating and cooling cycle resulting from the beam 108 of laser light incident thereon, causing it to separate from the underlying dielectric or polymer layer 404. The laser beam pulse 108 is only partially absorbed by the underlying dielectric or polymer layer 404 so that only a small part of the energy of the beam 108 reaches the metal-substrate interface. The discontinuity at the interface thus produces a high electric field gradient, which cause the thin metal seed layer 402 to be ejected from the surface of the substrate 104 at a high speed. The ablated metal layer 408 (e.g., as shown in FIG. 4D) that is ejected from the substrate 104 is similar to a fine powder, which can then be reclaimed using the debris collection system 200 described above in connection with FIG. 2 as it is being ablated. Since the metal seed layer 402 in the area 406 is "shocked" from the surface of the substrate 104 and not directly cut or burned away, the underlying dielectric or polymer material 404 is not damaged during the process.

Figure 5A:
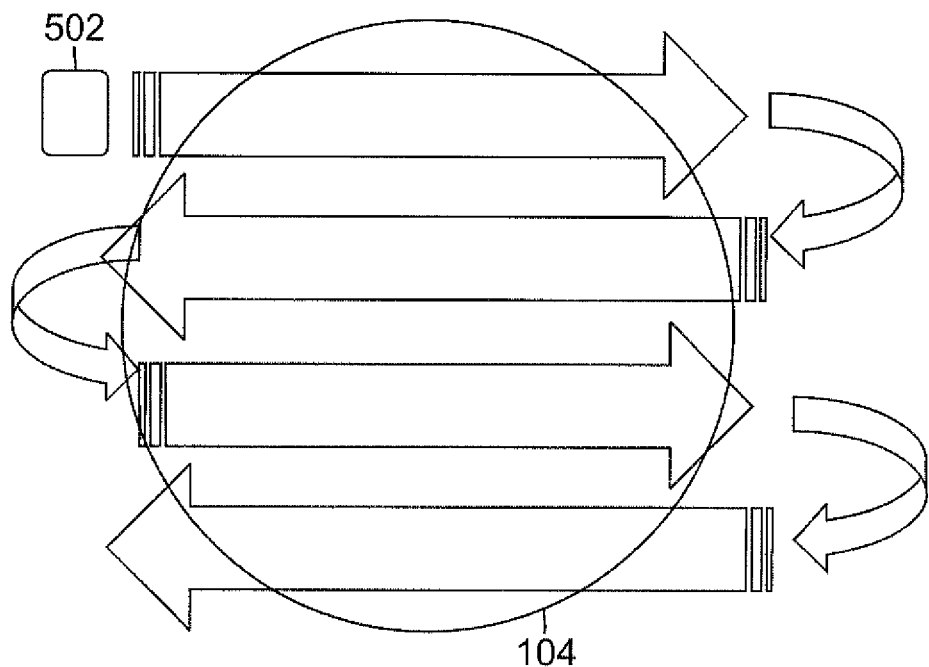
FIGS. 5A and 5B are schematic top plan views of a wafer, showing alternative methods for sweeping a laser beam relative to a surface of the wafer from which a surplus seed layer is being removed in accordance with an embodiment of the present invention.

The amount of laser energy required to remove the seed layer 402 is quite low, and thus, it is possible to remove large areas of seed metal at a time, offering attractive throughput in comparison to the conventional alternatives of the wet, dry or plasma etch processes. As illustrated in FIG. 5A, a serpentine scan, indicated by the alternating transverse arrows, of a small square or rectangular laser beam area 502 can be sequentially stepped and repeated over the entire surface of the substrate 102 to ablate away the seed layer 402. Alternatively, as indicated by the single transverse arrow in FIG. 5B, this can also be effected in a stepped, single-pass scan across the substrate 104 of a relatively narrow laser beam area 504 that is longer than the substrate 104. In either embodiment, while scanning/stepping across the substrate 104, the laser apparatus 100 is operated in a pulsed fashion, causing the seed layer 402 in the area 502 or 504 currently being illuminated by the laser beam 108 to be ablated away without damaging the underlying materials or the adjacent, thicker metalized circuitry patterns 410 (see FIGS. 4A-4D).

A rectangular or square shaped laser beam 108 is sized to best match the substrate size and the fluence required at the substrate 104 to ablate away the metal seed layer 402. As the substrate 104 is moved at some predetermined velocity, a portion of the substrate is exposed to the UV laser light, for example, at wavelengths of 308 nm or 248 nm Eventually, all of the substrate 104 will be exposed to the laser beam 108; however, as above, only the seed layer 402 reacts when the proper fluence is applied.

Figure 5B:
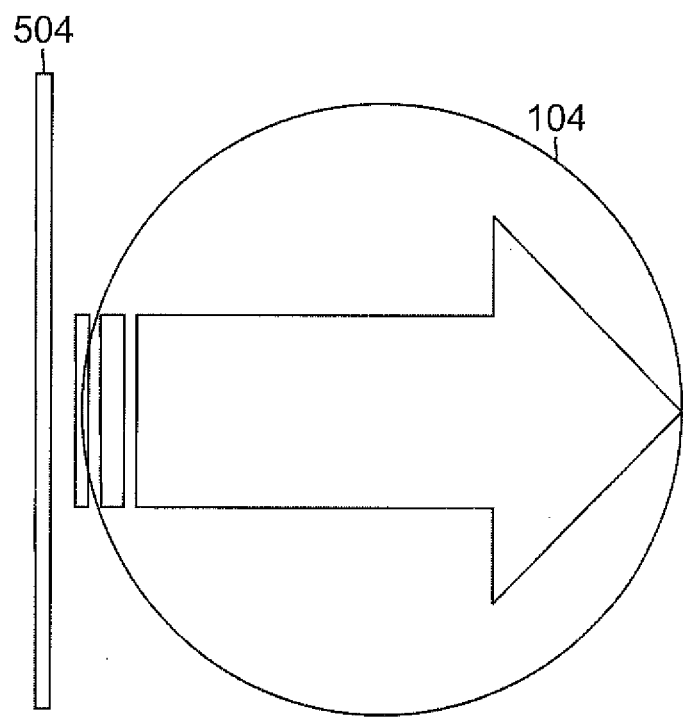

The size of the laser ablation beam 108 used is affected by several factors, including, for example, the size of the substrate 104, the fluence required at the substrate for effective ablation, available power, and the like. In any case, as illustrated in FIGS. 5A and 5B, the laser beam 108 is continuously scanned across the surface 206 of the substrate 104 by, for example, moving the substrate 104 and X-Y translation stage 102 across the laser beam 108, with the laser apparatus 100 pulsing at a given frequency. In this fashion, the laser beam 108 is "stepped" across the substrate 104 until the entire substrate has been illuminated. Thus, after one corresponding section 502 or 504 of the irradiated metal seed layer 402 has been removed, a new section of the substrate 104 that has not been ablated is moved under the laser beam 108, where the laser apparatus 100 is again pulsed and the metal seed layer 402 in the corresponding irradiated area 502 or 504 removed. This "step, pulse, and repeat" process can be implemented at very high rates of speed, typically limited only by the speed of travel of the stage 102 relative to the laser ablation apparatus 100, or as discussed above, vice-versa.

Figure 6A:
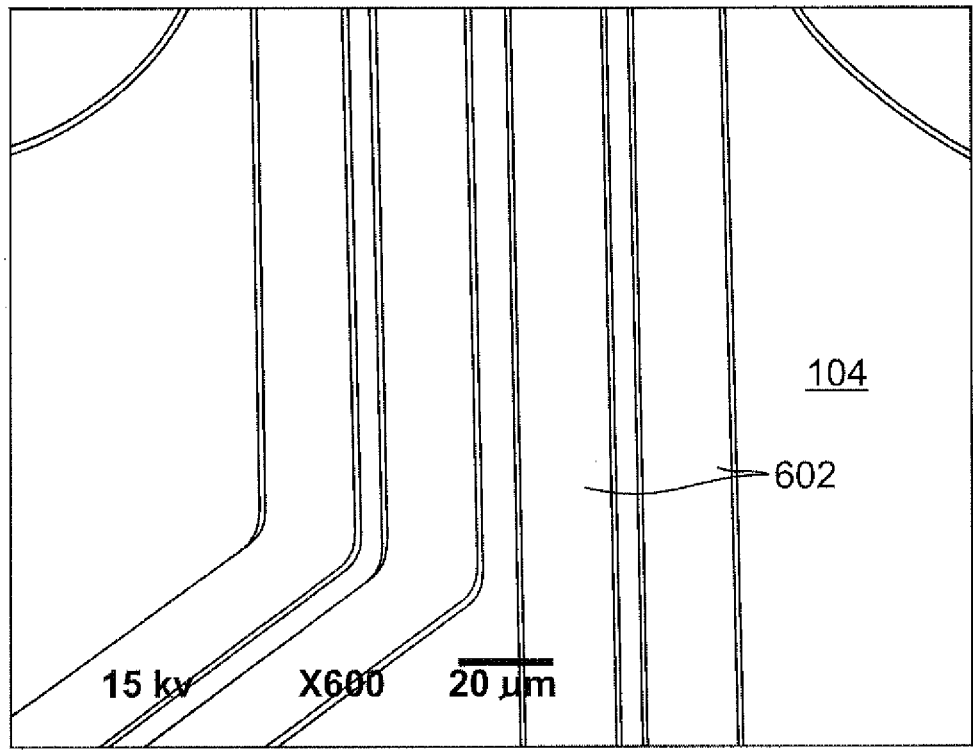
FIGS. 6A and 6B are photomicrographs of portions of a substrate from which a surplus seed layer has been removed in accordance with an embodiment of the present invention, respectively taken at different magnifications; and, FIGS. 7A and 7B are process flow diagrams respectively showing sequential steps involved in the formation of conductive trace structures on a surface of a substrate and the subsequent removal of a surplus seed layer therefrom in accordance with an embodiment of the present invention.
Figure 6B:
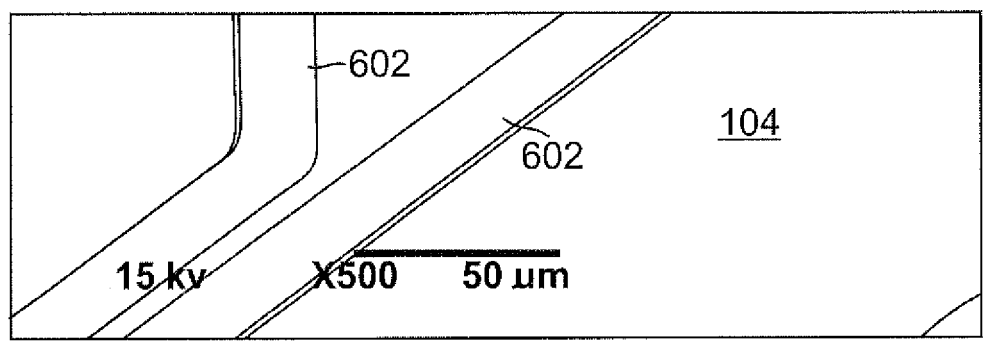

FIGS. 6A and 6B are photomicrographs, taken at magnifications of ×600 and ×500, respectively, of a substrate 104 having a number of metal (Cu) circuit traces 602 formed thereon, and from which the surplus seed layer has been removed by laser ablation in accordance with an embodiment of the present invention. As can be seen in FIGS. 6A and 6B, the laser ablation method enables the production of very fine and closely spaced conductive structures 602 with no undercutting and with sharp, distinct edges having no seed layer bridging or shorting between them.

Figures 7A, 7B:
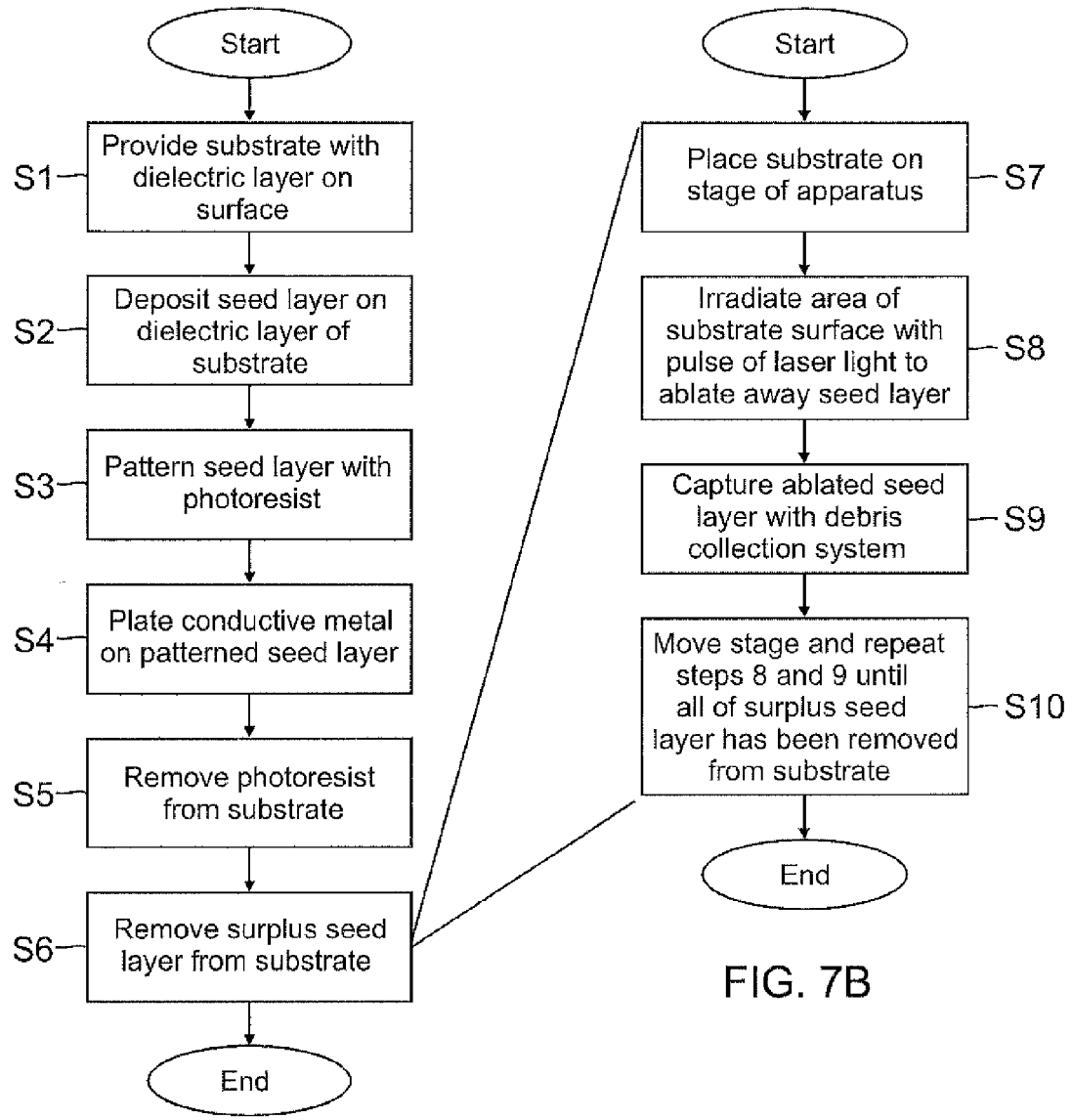

FIGS. 7A and 7B are process flow diagrams respectively illustrating the sequential steps involved in the production of a substrate having conductive structures formed on a working surface thereof like those illustrated in FIGS. 6A and 6B and from which the surplus seed layer has been removed from the substrate surface in accordance with one or more embodiments of the present invention.

Referring to FIG. 7A, the process begins at S1 with the provision of a substrate having a either a dielectric or polymer surface or a dielectric layer, e.g., a polymer layer, formed thereon. At S2, a conductive seed layer, e.g., Ti/Cu, is formed on the dielectric or polymer surface or layer, e.g., by sputtering.

At S3, a photoresist is applied to the seed layer, where it is patterned using conventional photolithography and developing techniques, and at S4, a conductive metal, e.g., Cu, is deposited in the openings of the developed photoresist, e.g., by plating it thereon.

At S5, the photoresist is removed from the substrate, e.g., using photoresist stripping techniques, and at S6, the surplus seed layer is ablated from the substrate in accordance with the apparatus and methods described above. As illustrated in FIG. 7B, these include, at S7, placing the substrate on the stage of a laser ablation apparatus 100 of the type described above in connection with FIG. 1, and at S8, irradiating an area on the surface of the substrate with a pulse of laser light from the apparatus having a fluence effective to ablate away the surplus seed layer therefrom.

At S9, the seed layer ablated away from the substrate at S8 is captured using, e.g., the debris capture system 200 discussed above in connection with FIG. 2, and at S10, the stage is moved to an adjacent position and steps S8 and S9 are repeated in a step-and-repeat fashion until all of the surplus seed layer has been removed from the surface of the substrate.

In accordance with one or more embodiments, systems and methods are provided for removing surplus seed layers from substrates using laser ablation techniques. The techniques disclosed herein may provide certain advantages over conventional approaches. For example, a method in accordance with an embodiment may recoup the surplus seed layer as it is laser irradiated from a substrate (e.g., with a debris removal and collection system), which under conventional approaches would otherwise be disposed of or treated as a hazardous waste. As another example, a method in accordance with an embodiment may eliminate the need to pre-clean the substrate prior to removal of the surplus seed layer from the surface of a substrate, which may provide an advantage over a conventional approach. In accordance with an embodiment, one or more techniques disclosed herein may reduce manufacturing costs and cost of ownership (e.g., provide a reduction of wet chemistry, a reduction of hazardous chemical disposal, a reclamation of surplus seed metals, and/or a high throughput).

As those of skill in this art will by now appreciate, many modifications, substitutions and variations can be made in and to the materials, apparatus, configurations and methods of the excess seed layer removal system in accordance with one or more embodiments of the present invention without departing from its spirit and scope. Accordingly, the scope of the present invention should not be limited to the particular embodiments illustrated and described herein, as they are merely by way of some examples thereof, but rather, should be fully commensurate with that of the claims appended hereafter and their functional equivalents.

What is claimed is:

1. An apparatus for removing a material from a surface of a substrate, the apparatus comprising:
   a stage configured to receive and hold the substrate;
   a device for irradiating the surface with laser light;
   a projection lens disposed on the irradiating device; and
   a debris removal system disposed between the projection lens and the surface of the substrate to move conjointly with the irradiating device and operable to collect the material removed from the substrate by the laser light, wherein the projection lens is operable to condense and focus the laser light through an opening of the debris removal system and onto the surface of the substrate.

2. The apparatus of claim 1, wherein:
   the stage is operable to move relative to the irradiating device;
   the irradiating device is operable to move relative to the stage; or
   the stage and the irradiating device are each operable to move relative to the other.

3. The apparatus of claim 1, wherein the material comprises a thin layer of a metal.

4. The apparatus of claim 1, wherein the irradiating device comprises a laser light source operable to produce a beam of coherent laser light having a predetermined wavelength.

5. The apparatus of claim 4, wherein the laser light source comprises a solid state, an LED or a gas laser.

6. The apparatus of claim 5, wherein the gas laser comprises an excimer laser.

7. The apparatus of claim 6, wherein the excimer laser uses as a gain medium a combination of a noble gas comprising at least one of the group consisting of argon, krypton, and xenon, and a reactive gas comprising at least one of the group consisting of fluorine and chlorine.

8. The apparatus of claim 4, wherein the irradiating device further comprises at least one of the group consisting of:
 a turning mirror arranged to alter the direction of the light beam;
 a shutter operable to selectably block or allow passage of the light beam;
 an attenuator operable to selectably attenuate the light beam;
 an anamorphic tunnel operable to control the shape of the light beam;
 a homogenizer operable to control the uniformity of the light beam;
 an anamorphic condenser lens operable to selectably shape and focus the light beam; and
 a mask configured to crop the light beam.

9. The apparatus of claim 1, wherein the debris removal system comprises:
 a frusto-conical chamber with an open top and bottom providing the opening to pass the laser light through;
 a plurality of jets disposed around a periphery of the chamber for jetting streams of a gas onto the upper surface of the substrate; and
 an exhaust pump operable in combination with the jets to create a high velocity cross-flow of the gas in the chamber that sweeps away and collects the material removed from the substrate surface.

10. A method for removing a material from a surface of a substrate, the method comprising utilizing the apparatus of claim 1.

11. The method of claim 10, wherein the utilizing comprises irradiating the surface with a fluence of the laser light effective to ablate the material from the surface.

12. The method of claim 11, wherein the irradiating comprises irradiating a selected area of the surface of the substrate with a pulse of the laser light to provide a selected fluence of the laser light.

13. The method of claim 12, wherein the irradiating comprises irradiating the entire surface of the substrate in a step, pulse and repeat process.

14. The method of claim 13, wherein the step, pulse and repeat process is effected in a straight pass across the surface of the substrate.

15. The method of claim 14, wherein the step, pulse and repeat process is effected in a serpentine pass across the surface of the substrate.

16. The method of claim 11, further comprising utilizing the debris removal system for collecting and storing the material removed from the surface of the substrate simultaneously with the irradiating.

17. The method of claim 16, further comprising recycling the material collected.

18. A method for making conductive traces on a surface of a substrate, the method comprising:
 forming a dielectric layer on the surface of the substrate;
 forming a seed layer of an electrically conductive material on the dielectric layer;
 forming a layer of photoresist on the seed layer;
 patterning the photoresist on the seed layer;
 forming the conductive traces on the patterned photoresist and seed layer;
 removing the photoresist from the substrate;
 irradiating the surface of the substrate with a fluence of laser light effective to ablate the seed layer from areas of the substrate surface exclusive of the conductive traces; and
 collecting the material of the seed layer removed from the surface of the substrate with a debris removal system, wherein
 the irradiating comprises irradiating the substrate through a central opening of the debris removal system.

19. The method of claim 18, wherein:
 the substrate comprises a semiconductor;
 the dielectric layer comprises an oxide of the semiconductor or a polyimide; and
 the seed layer comprises copper (Cu), titanium (Ti), titanium/copper (Ti/Cu), titanium tungsten/copper (TiW/Cu), titanium (Ti), chrome/copper (CrCu), nickel (Ni), palladium (Pd).

20. An apparatus, comprising:
 a stage adapted to receive and hold a substrate;
 means for projecting a beam of laser light onto a surface of the substrate, the beam impinging on the surface with a selected cross-sectional area and fluence effective to remove a material from the surface of the substrate;
 means for continually moving the stage and the projecting means relative to each other during operation of the projecting means; and
 means for collecting and storing the material removed from the substrate,
 wherein the collecting and storing means is disposed between the projecting means and the surface of the substrate for conjoint movement with the projecting means, and
 wherein the collecting and storing means comprises an opening to pass the beam of laser light therethrough.

21. The apparatus of claim 20, wherein areas of the surface impinged by the beam of laser light are disposed immediately adjacent to or overlap each other.

22. The apparatus of claim 20, wherein the beam of laser light is substantially homogenous in terms of its wavelength, phase and polarization.

23. The apparatus of claim 20, wherein the beam of laser light is effective to shock, vaporize or ablate a layer of a material on the surface of the substrate.

24. The method of claim 18, wherein the irradiating is by an irradiating device, and wherein the method further comprises moving the irradiating device conjointly with the debris removal system.

* * * * *